United States Patent [19]

Coussot et al.

[11] 3,924,312

[45] Dec. 9, 1975

[54] METHOD OF MANUFACTURING AN ELECTROMECHANICAL SYSTEM HAVING A HIGH RESONANCE FREQUENCY

[75] Inventors: Gerard Coussot; Eugene Dieulesaint, both of Paris, France

[73] Assignee: Thomson-CFS, Paris, France

[22] Filed: Feb. 26, 1974

[21] Appl. No.: 445,900

Related U.S. Application Data

[62] Division of Ser. No. 352,985, April 20, 1973, abandoned.

[30] Foreign Application Priority Data

Apr. 25, 1972 France .............................. 72.14638

[52] U.S. Cl. .................... 29/25.35; 29/492; 29/502; 310/8.2; 310/9.4

[51] Int. Cl.[2] ........................................... H01L 41/22

[58] Field of Search .................... 29/25.35, 492, 502; 310/8.2, 9.1–9.4

[56] References Cited

UNITED STATES PATENTS

| | | | |
|---|---|---|---|
| 2,709,147 | 5/1955 | Ziegler | 29/25.35 |
| 3,073,975 | 1/1963 | Bigler et al. | 310/9.2 |
| 3,173,035 | 3/1965 | Fisher | 310/9.1 |
| 3,396,287 | 8/1968 | Horton | 310/9.1 |
| 3,527,967 | 9/1970 | Dyer et al. | 310/8.2 |

*Primary Examiner*—Carl E. Hall
*Attorney, Agent, or Firm*—Cushman, Darby & Cushman

[57] ABSTRACT

The invention relates to a method of manufacturing an electromechanical resonator comprising a substrate provided, in one of its faces, with a recess and a piezoelectric wafer adhering to said substrate at the periphery of said recess. The resonating portion of the device is delimited by electrodes deposited upon the respective faces of said wafer, the electrode located upon the free face of said wafer being located above said recess. The method comprises flattening the adjacent faces of the wafer and substrate and depositing films on said faces which may be secured together to form a conductive layer. The thickness of the wafer is reduced by erosion of its free face following which an electrode is deposited on said free face.

4 Claims, 4 Drawing Figures

METHOD OF MANUFACTURING AN ELECTROMECHANICAL SYSTEM HAVING A HIGH RESONANCE FREQUENCY

This application is a division of application Ser. No. 352,985, filed Apr. 20, 1973, now abandoned.

The present invention relates to electromechanical resonators designed for the construction of devices such as oscillators, filters and frequency discriminators. An electromechanical resonator is constituted by a wafer of piezoelectric material equipped with electrodes on both faces; this kind of two-terminal device has an electrical admittance the very sharp maxima and minima of which make it possible to define a resonance frequency and an antiresonance. The fundamental frequencies of an electromechanical resonator are higher the smaller the thickness of the wafer is; this explains why the resonator structures currently manufactured cannot cover a frequency range of more than some few tens of megacycles, because beyond this range the wafers are too fragile. Modern ion-machining techniques, however, have made it possible to manufacture extremely thin wafers which can be used in the manufacture of high frequency resonators; however, the method of assembly habitually employed for resonator wafers is unsuitable here because it gives rise to the need for delicate operations, and the end products are extremely fragile.

The solution which involves the use of a relatively strong wafer operating in accordance with a partial mode, is merely a palliative since the frequency of the fundamental mode is still relatively low. Another solution is to deposit an extremely thin piezoelectric film upon a substrate acting as a cavity, but this solution, although attractive at first sight, gives rise to a not insubstantial degree of damping of the vibrational energy, and of many parasitic modes.

To overcome these drawbacks, the invention proposes an electromechanical system in which the thin wafer is attached exclusively by its circumference to a recessed substrate; the electrodes define a vibrational zone which, at its centre, is located directly above the recess in the substrate, so that the vibrational energy remains confined to the volume of said zone.

The object of the present invention is to provide a method of manufacturing an electromechanical system of high resonance frequency, comprising at least one strip or wafer of piezoelectric material equipped on both faces with a least one pair of electrodes, and attached to a rigid substrate, wherein said rigid substrate exhibits a recess overlapping the vibrational zone delimited by said electrodes; said wafer being attached to said substrate at the periphery of said recess.

Figure 1:
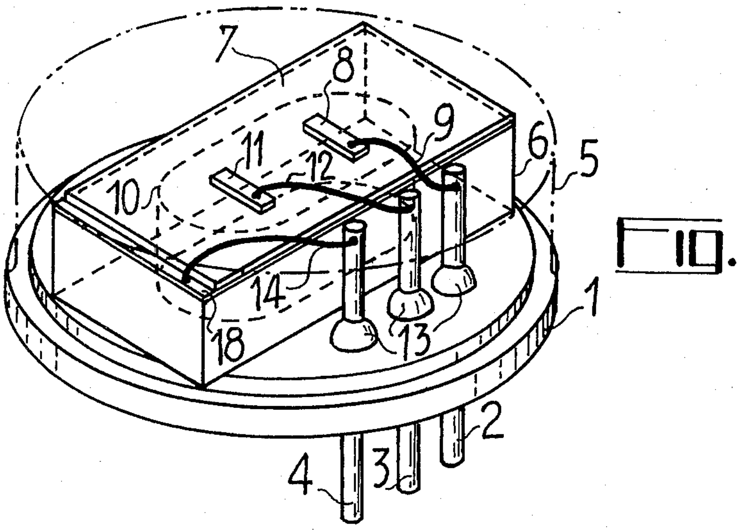

The invention will be better understood from a consideration of the ensuing description and the attached figures in which:

FIG. 1 is an isometric view of an electromagnetic produced in accordance with the invention.

FIGS. 2*a*–2*d* illustrate the method of manufacture of the system shown in FIG. 1.

Figure 3:
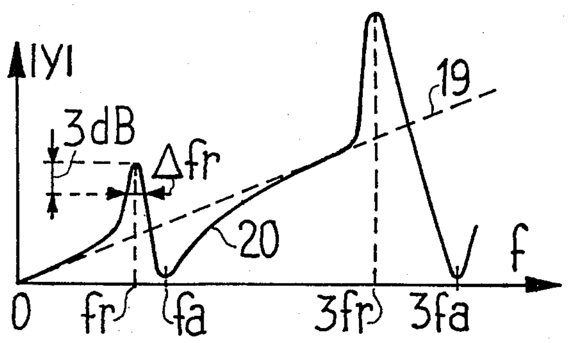
Figure 4:
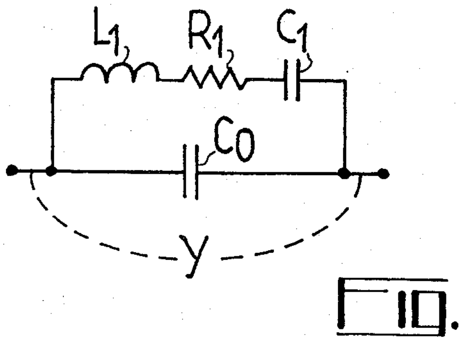

FIGS. 3 and 4 are explanatory diagrams.

In FIG. 1, an electromechanical filter can be seen comprising two coupled resonators designed to effect selective transmission of a band of high frequencies.

The filter consists of a base 1 equipped with three connecting pins 2, 3 and 4 mechanically attached to the base by insulating leadthroughs 13. Crimped to the periphery of the base 1, there is a cover 5 and at its centre there is attached a rigid substrate 6. The substrate 6 contains a recess 10 illustrated in broken line; this recess, as FIG. 1 shows, can extend through the substrate from one side to the other or, on the other hand, may be no more than a hollow in its top face. The top face of the substrate 6 carries a conductive coating 18 electrically connected to the pin 4 by a lead 14. A thin wafer 7 of piezoelectric material is attached to the coating 18 and overlaps the recess 10 in the substrate 6. The top face of the wafer 7 carries two electrodes 8 and 11 which are respectively connected to pins 2 and 3 by leads 9 and 12. Electrodes 8 and 11 are located well within the contour of the recess 10 and respectively delimit, vis-a-vis the mating electrode 18, two vibrational zones within the wafer 7, which can vibrate either in the longitudinal mode, or in the transverse mode. The longitudinal mode corresponds to vibrational amplitudes directed perpendicularly to the plane of the larger faces of the wafer 7, whilst the transverse mode corresponds to the vibrational amplitudes directed parallel to the said plane.

Because of the presence of the recess 10, the larger faces of the wafer 7 are completely free within the region located above said recess; the result is that these faces are located at the vibrational antinodes of the stationary wave which develops under the effect of an alternating voltage applied to the pairs of terminals 3, 4 or 2, 4.

The alternating current or voltage appearing between the terminals of a resonator, is associated with the mechanical quantities which determine the stationary vibration in the piezoelectric wafers; the ratio of these quantities can be represented by an electrical admittance Y the elements of which are illustrated in the equivalent electrical diagram of FIG. 4.

In this diagram, a capacitor $C_o$ defines the capacitance existing between the electrode 8 or 11 and the mating electrode 18; the oscillatory circuit $L_1$ $R_1$ $C_1$ connected in parallel across $C_o$, represents the inherent resonance and damping properties of the wafer 7. The inductance $R_1$ and the capacitance $C_1$ determines one of the natural frequencies of oscillation of the wafer, and the resistance $R_1$ represents the damping of the oscillations.

In FIG. 3, the modulus $|Y|$ of the electrical admittance of a resonator has been plotted as a function of the frequency $f$.

The dotted line 19 illustrates the admittance of the capacitor $C_o$. The full line curve 20 represents the law of variation of $|Y|$;

it exhibits a first peak at the resonance frequency $f_r$, since this frequency is the one at which the wafer exhibits a half-wave vibration in the fundamental mode; this peak is followed by a minimum corresponding to the antiresonance frequency $f_a$. As the frequency $f$ continues to rise, maxima and minima such as $3f_r$ and $3f_a$ are observed, which correspond to the partial vibrational modes of the wafer; it should be pointed out that the third order partial mode gives frequencies $3f_r$ and $3f_a$ which are not precise multiples of the frequencies $f_r$ and $f_a$. In order to assess the qualities of a resonator, its quality factor Q must be assumed to be equal to the ratio of the frequency $f_r$ to the width $\Delta f_r$ at $-3$ dB from its point of resonance; it is also necessary to assume its coupling factor $k$ as being given by the relationship:

$$k^2 = \frac{f_a^2 - f_r^2}{F_a^2}$$

Experience shows that by utilising a recessed substrate as illustrated in FIG. 1, it is possible to produce high frequency resonators having a substantial quality factor, due to the fact that the vibrational zone is well decoupled from the substrate. As far as the coupling factor is concerned, performance is equally good as the following practical example illustrates: an electromechanical system produced, using a wafer of monocrystalline lithium niobate attached by soldering to a recessed silica substrate, made it possible in operation at the third order partial mode, to achieve: a resonance frequency of 230 megacycles, a quality factor of 460 and a coupling factor of 0.05.

By utilising a critically coupled pair of resonators, the frequency band transmitted by this kind of filter can be made relatively wide.

Although the thickness e of the lithium niobate wafer is only 50 microns, the fact that it is assembled upon the substrate means that it is relatively strong.

It should be pointed out that resonators can be produced having a wafer thickness of less than 50 microns. By utilising lithium tantalate which has a smaller thermal drift than lithium niobate, it is possible to produce a resonator whose fundamental frequency is in the order of 100 MHz.

In contemplating the design of a filter, at least two electrodes must be provided close together on the top face of the wafer 7; their spacing is chosen in order to yield the desired coupling and their distance from the periphery of the recess is chosen to achieve substantial decoupling vis-a-vis the substrate 6.

It is also possible to utilise the system shown in FIG. 1 in order to create a simpler resonator, by suppressing one of the electrodes 8 or 11. Again, a double resonator can be created by providing around each of the electrodes 8 and 11, its own recess. In this case, the electrodes 8 and 11 are spaced apart, in order to prevent any unwanted coupling between the resonators and, if required, an intermediate area of support for the wafer, by the substrate, is provided between the electrodes.

The manufacture of the electromechanical system shown in FIG. 1, is a delicate matter if the wafer 7 is reduced in thickness for attachment to the substrate, this wafer in other words being extremely fragile and difficult to handle.

Figure 2:
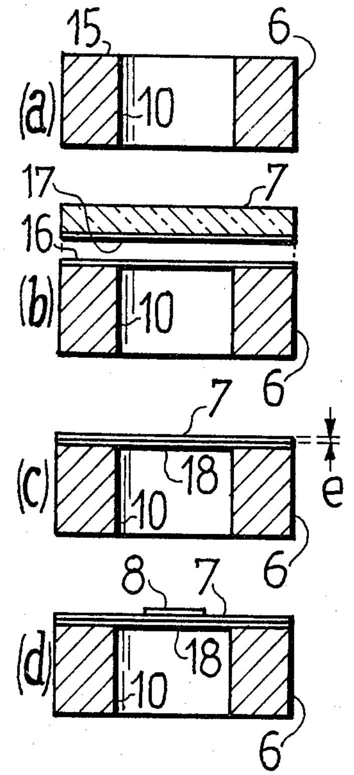

To overcome these drawbacks, the invention proposes a method of manufacture the chief stages of which are schematically illustrated in FIG. 2. In order to facilitate explanation, in FIG. 2 only one device has been shown; however, in one and the same operation, several devices can be attached together and only separated from one another by a sawing operation, just before the final stage of encapsulation.

The first stage illustrated at (*a*) consists in carefully producing a flat finish on the top face 15 of a substrate 6 complete with recess 10.

As FIG. 2 illustrates at (*b*), the top face 15 of the substrate is coated with a vapourised film of indium 16 whilst a similar film 17 is deposited upon the flat face of a piezoelectric wafer 7; by placing the films 16 and 17 into contact with one another under pressure, the wafer 7 is intimately welded, by metal diffusion, to the substrate 6 and adheres perfectly to the periphery of the recess 10. The wafer 7 welded to the substrate 6 has a greater thickness than that required for operation at the desired frequency. Thus, as illustrated at (*c*) in FIG. 2, it is necessary to machine the top face of the wafer 7 in order to reduce its thickness to the size *e* required. The machining of the top face of the wafer 7 can be carried out by abrasion using conventional techniques, but it is advantageous to utilise the technique of ion machining if the wafer is particularly thin and of small size. The last operation, after machining, carried out on the top surface of the wafer 7 consists in depositing thereon an electrode 8 which is located above the recess 10. As illustrated at (*d*) in FIG. 2, the electrode 8 cooperates with the mating electrode 18 produced by the welding of the films 16 and 17. The advantage of ion machining resides in the fact that it is possible to thin the wafer 7 in the zone covering the recess 10, i.e. it is unnecessary to thin the edges of the wafer 7. In the example described earlier, the electrode 8 can be constituted by a metal spot 0.1mm in diameter, located at the centre of a dish having a diameter of 7 mm; the dish is hollowed out in the centre of a silica Dee having a side length of 10 mm and a thickness of 2 mm. In order for the mating electrode 18 to be as large as possible, during a first phase annular indium films can be deposited for subsequent welding, and in a second phase, there can be vapour-deposited at the centre of these films an extremely thin film of metal similar to that which forms the electrode 8 located opposite. The recessing of the substrate can be produced by ion machining.

In order to achieve good adhesion of the wafer to the substrate, the films placed in contact for the welding operation can be produced in two stages:

In a first stage, there is vapour-deposited upon the faces which are to be attached by welding, a gold layer, and in a second phase the appropriate indium layer.

Welding is carried out by diffusion of the indium into the gold and between the mutually touching layers. It goes without saying that the vapour-deposition of indium upon the gold layer can be carried out in such a way as to leave free the region which is to located above the recess in the substrate; this precaution makes it possible to reduce the mass of the mating electrode.

Of course, the invention is not limited to the embodiment described and shown which was given solely by way of example.

We claim:

1. A method of manufacturing an electromechanical system having a high resonance frequency, the system comprising at least one wafer of piezoelectric material having at least one pair of electrodes secured to opposite faces of the wafer, said wafer being attached to a rigid substrate at the periphery of a recess therein, said recess overlapping a vibrational zone in the wafer delimited by said electrodes, the method comprising the steps of:

flattening a face of said substrate containing the recess;

depositing a first film of metal on said face;

flattening a face of said wafer;

depositing a conductive layer of gold on the flattened face of the wafer;

depositing a second film of metal onto the gold layer, said second film overlying an annular region of said wafer said region, corresponding to the periphery of said recess;

assembling said substrate and said wafer such that the first and second films contact each other and said annular region overlies the periphery of said recess;

securing together the substrate and the wafer by surface bonding the metals of the first and second films;

reducing by erosion the thickness of the wafer at a face thereof opposite that to which said conductive layer is deposited; and depositing an electrode on the erosion reduced face of the wafer.

2. A method of manufacturing as claimed in claim 1 wherein said erosion is carried out by ion machining.

3. A method of manufacturing as claimed in claim 1, wherein the films are deposited by vapourisation.

4. A method of manufacturing as claimed in claim 1 wherein the metal of said first and second films is indium.

* * * * *